United States Patent
Svarfvar et al.

(10) Patent No.: US 6,576,832 B2
(45) Date of Patent: Jun. 10, 2003

(54) ELECTRONIC DEVICE MOLDED COVER HAVING A RELEASABLE EMI SHIELD

(75) Inventors: Bror Svarfvar, Kaarina (FI); Matti Uusimaki, Sahalahti (FI)

(73) Assignee: Nokia Mobile Phones Ltd., Espoo (FI)

( * ) Notice: Subject to any disclaimer, the term of this patent is extended or adjusted under 35 U.S.C. 154(b) by 45 days.

(21) Appl. No.: 09/801,277

(22) Filed: Mar. 7, 2001

(65) Prior Publication Data

US 2002/0125025 A1 Sep. 12, 2002

(51) Int. Cl.[7] .................................................. H05K 9/00
(52) U.S. Cl. ............................ 174/35 R; 174/35 MS; 455/117; 361/800; 361/816; 361/818
(58) Field of Search ..................... 174/35 R, 35 MS; 361/799, 800, 816, 818, 796, 752, 753; 455/90, 117, 575; 343/702, 841

(56) References Cited

U.S. PATENT DOCUMENTS 5,596,170 A * 1/1997 Barina et al. ............. 174/35 R
5,867,370 A * 2/1999 Masuda ....................... 361/800
6,243,274 B1 * 6/2001 Willis .......................... 361/816
6,275,683 B1 * 8/2001 Smith .......................... 455/90

OTHER PUBLICATIONS

Advertising brochure by 3M's Electronic Handling & Protection Division for 3M's EMI shielding materials, copyright 2000.

* cited by examiner

Primary Examiner—Dean A. Reichard
Assistant Examiner—Carmelo Oliva
(74) Attorney, Agent, or Firm—Ware, Fressola, Van Der Sluys & Adolphson LLP

(57) ABSTRACT

An electronic device molded cover is disclosed with a releasable EMI shield to facilitate removal to separate the EMI shield and the cover into respective individual parts for reuse as raw material in the production of similar product applications. The EMI shield is made of an electrically conductive fabric sheet having glue drops in a spaced relation on one face for attachment to the interior of the cover. In an alternate embodiment, a conductive polymer paint coating is applied to the interior of the cover.

20 Claims, 7 Drawing Sheets

ELECTRONIC DEVICE MOLDED COVER HAVING A RELEASABLE EMI SHIELD

TECHNICAL FIELD OF THE INVENTION

The present invention relates generally to electromagnetic interference (EMI) shielding in electronic devices and deals more specifically with EMI shielding for portable electronic devices such as cellular or radio telephones, and in particular with a molded cover having a releasable EMI shield for such electronic devices.

BACKGROUND OF THE INVENTION

Portable electronic devices, particularly portable handheld communication devices such as cellular or radio telephones and the like require electromagnetic interference (EMI) shielding to prevent any electromagnetic signals generated during operation of the device from escaping and interfering with other electronic devices. Likewise, EMI shielding prevents any externally generated electromagnetic signals from entering the device and interfering with its operation. Such electromagnetic signals often develop as a field or as a transient within the radio frequency band of the electromagnetic spectrum, i.e., from between approximately 10 kilohertz and 10 gigahertz. Cellular or radio telephones in particular are required by law to adhere to electromagnetic compatibility (EMC) limits as laid down in Type Approval Specifications for Mobile Phones. "EMC" is defined as the ability of a device to function properly in its intended electromagnetic environment and not to be a source of electromagnetic pollution to that environment. To reduce or attenuate the effects of EMI, shielding having the capability of absorbing and/or reflecting EMI energy may be employed both to confine the EMI energy within a source device and to insulate the device or other target devices from other source devices.

It is known to use a cover or housing shell made of metal to absorb and shield any EMI radiation energy generated by the electronic device. One drawback of such metal covers is the additional weight and cost that is added to the electronic device. Additionally, the demand for increasingly smaller portable electronic handheld devices has caused manufacturers to integrate as many functions as possible, including EMI shielding, to reduce both manufacturing cost and the amount of raw material needed. One common method to provide EMI shielding in portable electronic devices is to mold or otherwise fabricate the covers or case of the device from metallized plastic; i.e., plastic having metal or other conductive fibers integrated into the plastic. Although such metallized plastic covers may provide adequate EMI shielding, they are less than satisfactory for making an electrical ground connection between the cover and an electrical ground circuit path on the electronic circuit board containing the operational electronic components of the electronic device. Special bonding techniques and additional labor steps are required to ensure electrical connection to the metal in the plastic material forming the cover. A further disadvantage of such metallized plastic covers utilized for EMI shielding is that it is very difficult, if not impossible, to separate the metal or other electrically conductive fibers from the plastic material into their respective base materials for recycling.

It is generally desired for the recycling of the electronic device covers that the cover be a homogeneous structure containing a single thermoplastic polymer blend free of contaminants such as metal fibers and the like, particularly if the product is to be used as raw material for production of a similar product application. Additionally, environmental legislation directed to the recycling of electronic devices may require reuse of materials as raw material for similar product applications, in which case it will be necessary to separate the materials of the cover into respective contaminant-free base materials.

SUMMARY OF THE INVENTION

Accordingly, it is an object of the present invention to provide an EMI shielded cover for portable electronic devices, such as cellular or radio telephones, wherein the EMI shield is releasable from the cover to facilitate separation of the EMI shield material from the cover material.

In one aspect of the invention, a cover for an electronic device has an interior chamber formed by intersecting wall surfaces and an electromagnetic interference (EMI) shield conforming substantially to the size and shape of the interior chamber is juxtaposed with the interior wall surfaces. The EMI shield is removable from the interior chamber for separating the cover and the EMI shield into their respective individual parts.

Preferably, the EMI shield is an electrically conductive fabric sheet.

Preferably, the electrically conductive fabric sheet is releasably fastened to the surface of the interior wall by an adhesive applied to a face of the fabric sheet.

Preferably, the adhesive are drops of glue in a spaced relation from one another on a face of the fabric sheet.

Preferably, the adhesive is an adhesive spray.

Preferably, the adhesive is heat activated.

Preferably, the electrically conductive fabric sheet comprises a woven mesh of conductive fibers.

Preferably, the conductive fibers comprise a silver coated thread.

Preferably, the electrically conductive fabric sheet is pliable and further is stretchable.

Preferably, the electrically conductive fabric sheet is of sufficient strength to resist tearing during removal from the cover.

Preferably, the cover is molded from a thermoplastic polymer blend.

Preferably, the EMI shield is fitted to the interior chamber of the cover subsequent to the molding of the cover.

Preferably, the EMI shield is pre-formed to the size and shape of the interior chamber.

Preferably, the EMI shield is a coating of a conductive polymer paint applied to the interior wall surface, which surface has modified whereby the adhesion force between the conductive polymer paint coating and the surface of the interior wall is less than the inherent cohesion forces of the conductive polymer paint coating itself to allow peeling of the conductive polymer paint coating from the interior wall surfaces.

Preferably, portions of the EMI shield are in electrical and mechanical contact with an electrical ground reference potential surface area on a substrate carrying electronic circuit components of the electronic device when the substrate is assembled with the cover.

In a further aspect of the invention, a method for providing an EMI shielded electronic device molded cover comprises the steps of providing an EMI shielding material that is conformable to the shape of the interior of the cover; locating the EMI shielding material in the interior of the cover; and releasably securing the EMI shielding material to the interior of the cover, whereby the EMI shielding material is removable to separate the EMI shielding material from the cover without substantial contamination of each by the other to facilitate recycling of the EMI shielding material and the cover into the respective raw material of each.

Preferably, the step of providing an EMI shielding material further comprises providing an electrically conductive fabric sheet having an adhesive applied to a face of the fabric sheet.

Preferably, the step of providing an EMI shielding material further comprises the steps of reducing the adhesion properties of the surface of the interior of the cover and providing a coating of a conductive polymer paint on the interior surface of the cover.

BRIEF DESCRIPTION OF THE DRAWINGS

The above object and other features and advantages of the present invention will become apparent from the following written description taken in conjunction with the drawings, wherein.

DETAILED DESCRIPTION OF PREFERRED EMBODIMENTS

Figures 1, 2:
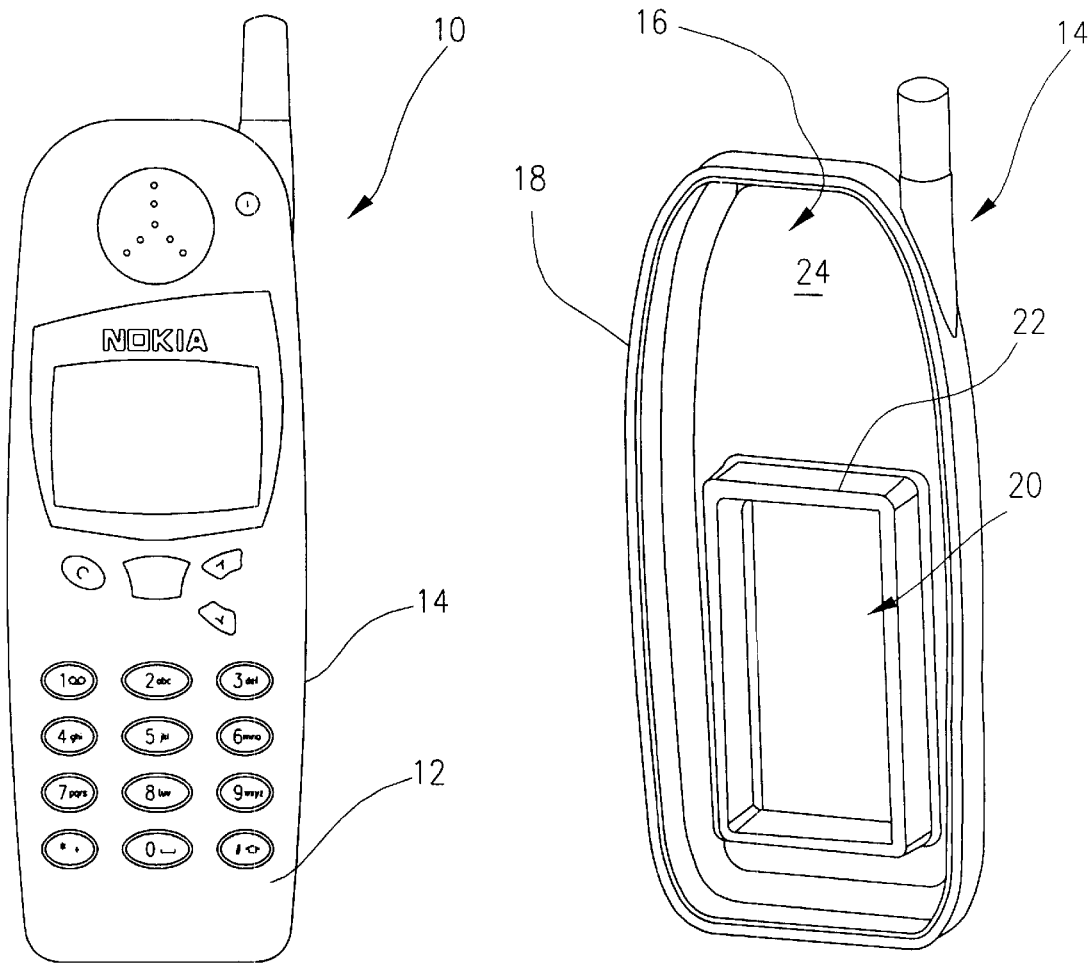
FIG. 1 is a top plan view of a cellular telephone of the type with which the EMI shield and cover of the present invention may be used.
FIG. 2 is a somewhat schematic perspective view of the inner portion of the rear cover of the cellular telephone of FIG. 1.

Turning now to the drawings and considering the invention in further detail, FIG. 1 is a top plan view of a cellular telephone of the type with which the present invention may be used and is generally designated 10. The cellular telephone 10 typically includes a case or housing made of a front or top cover 12 and a rear or back cover 14, which, when assembled, provides a chamber or enclosure in which the electronic circuitry and other components of the electronic device are housed and carried.

FIG. 2 shows by way of example a somewhat schematic perspective view of the rear cover 14 of the cellular telephone 10 illustrated in FIG. 1. For purposes of example only, the rear cover 14 is shown in simplified form and includes an interior rear wall 16 and rear wall surface 24 and an outer peripheral wall 18 extending therefrom and defining the interior area or volume of the rear cover 14. Within the interior area of the rear cover 14 is a further compartment or interior chamber 20 having walls 22 extending away from the surface 24 of the rear wall 16. Typically, the rear cover 14 is a molded piece and is made of a thermoplastic polymer blend or other such material well known to those in the electronic device molded cover art. There may be additional molded bosses extending from the surface 24 to define other interior compartments and/or to provide support posts, mounting brackets and the like.

Figure 3:
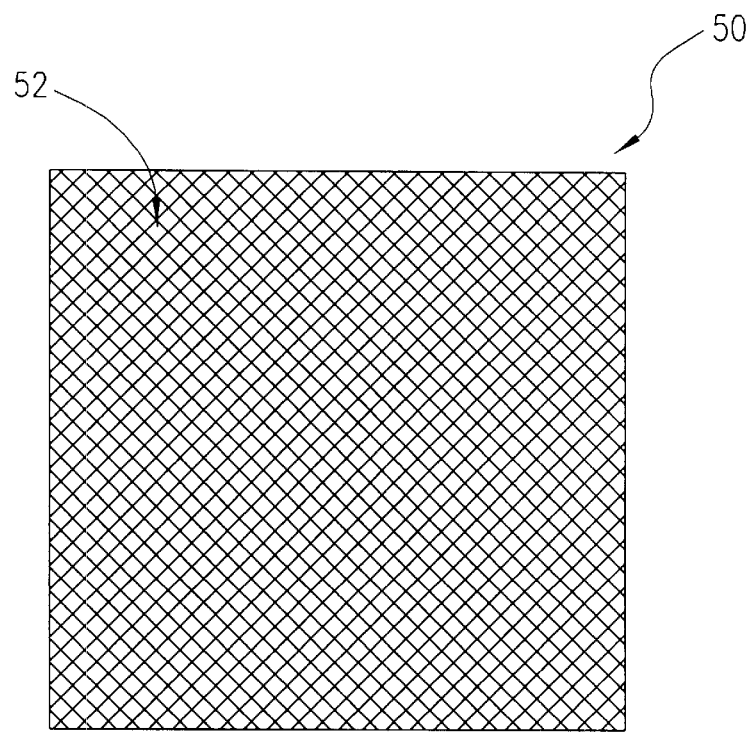
FIG. 3 is a top plan view of one embodiment of an EMI shield made of an electrically conductive fabric sheet.

FIG. 3 illustrates, in a somewhat schematic top plan view, an electrically conductive fabric sheet generally designated 50 having an undefined length and width. The fabric sheet 50 is preferably a mesh fabric, preferably woven into a fabric-like sheet with conductive materials thereby leaving the surface 52 continuously exposed for facilitating electrical contact thereto as will become apparent from the description herein below. The electrically conductive material forming the mesh may be metal, carbon threads, polymer filaments coated with silver, silver coated threads or other conductive coatings or other such electrically conductive material presently known or future-developed. The effectiveness of EMI shielding using such a fabric sheet increases as the mesh becomes denser with a dense fabric providing the best shielding effectiveness. Preferably, the fabric sheet 50 is pliable and stretchable so that it is conformable, without creasing, to the shape of the interior of the cover with which it is used.

Figure 4:
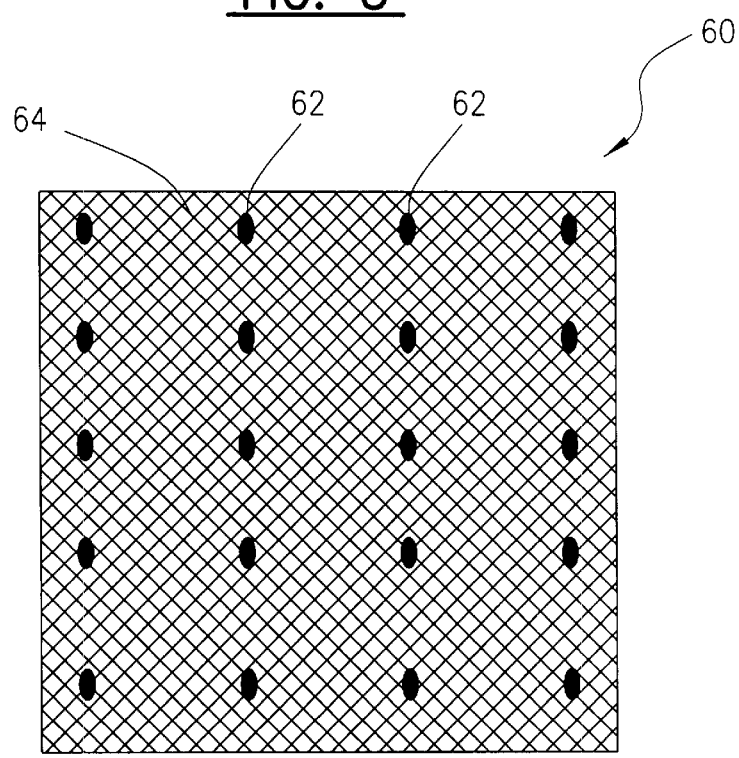
FIG. 4 shows glue drops on one face surface of the electrically conductive fabric sheet of FIG. 3.

Turning now to FIG. 4, the electrically conductive fabric sheet 50 illustrated in FIG. 3 is shown in FIG. 4 and generally designated 60 and includes drops of glue 62 in a spaced relation with one another on a face 64 of the fabric sheet 60. The drops of glue 62 are used as a means to adhere the fabric sheet to the surface of the interior of the cover when the fabric is placed in the cover during manufacture and during the life of the product. The glue drops may be heat activated or pressure sensitive and provide a degree of adhesion such that the fabric sheet can be removed from the surface of the interior of the cover to which it is attached. Providing the electrically conductive fabric mesh with glue drops or other adhesives such as, for example, spray adhesives or contact adhesives, already provided on one surface allows placement and attachment of the EMI shield within the interior of the cover without performing additional steps. The electrically conductive fabric sheet may be pre-formed to the size and shape of the interior of the cover with which it is used or may be located within the cover and then cut to size after attachment to the interior of the cover.

Figure 5:
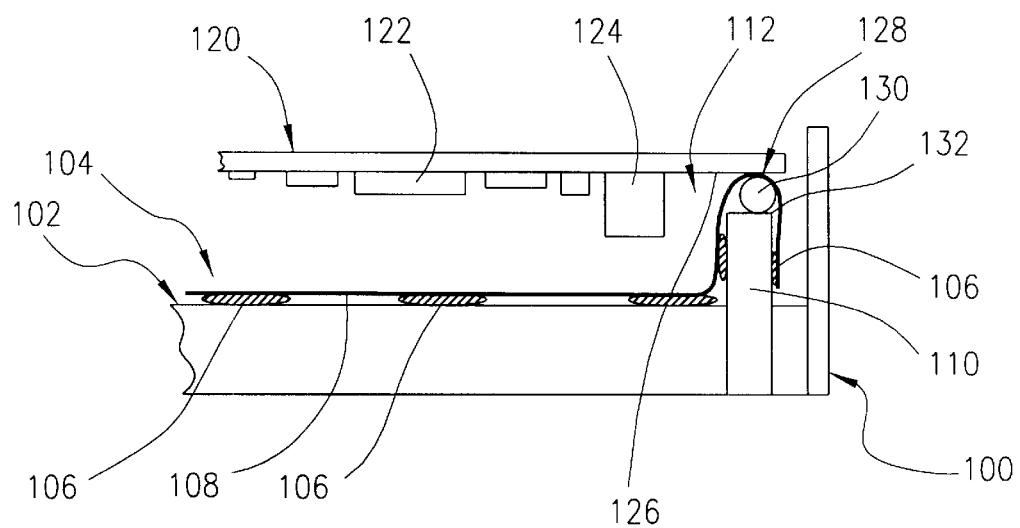
FIG. 5 is a schematic side view of the electrically conductive sheet of FIG. 4 attached to the inner surface of a device cover and located between the cover and an electronic printed circuit board within the device.

Turning to FIG. 5, a schematic side view of the EMI shield embodying the present invention is illustrated therein as it may be used with a cover of an electronic device. The cover of the electronic device is generally designated 100 and is shown in a fragmentary view. The cover 100 includes an inner surface 102 to which the EMI shield generally designated 104 is attached by means of glue drops 106 located on the face 108 of the EMI shield 104 facing the surface 102 of the cover 100. The fabric comprising the EMI shield 104 is shown as it might be formed over a wall or boss 110 extending from the surface 102 of the cover 100 inwardly into the interior 112 of the cover 100. An electronic printed circuit board or other such substrate generally designated 120 carries electronic components 122, 124 mounted thereon and which electronic components in operation may generate electromagnetic signals or may be susceptible to interference from externally generated electromagnetic signals. The printed circuit board 120 is mounted in a manner well known to those skilled in the cellular telephone art and will not be described here in detail. The printed circuit board 120 typically carries an electrical ground reference potential printed circuit path on a side 126. As illustrated in FIG. 5, the EMI shield 104 comes in contact with the electrical ground reference potential circuit path surface area in the region 128 without the necessity of additional wiring or other electrical connection mechanisms. A non-conductive gasket 130 or other suitable resilient material may be located along an upper surface 132 of the wall 110 between the surface 132 and the EMI shield 104. When the printed circuit board 120 is mounted to the cover 100, it is brought into contact with the EMI shield 104, which is urged against the ground reference potential circuit path on the printed circuit board by the gasket 130, when present, to provide a further reliable mechanical and electrical connection between the EMI shield and the electrical ground of the circuit. Additionally, the EMI shield 104 aids in dissipation of heat generated by the circuit due to the natural thermal conductivity of the metallic fibers or threads forming the electrically conductive fabric sheet of the EMI shield.

Figure 6:
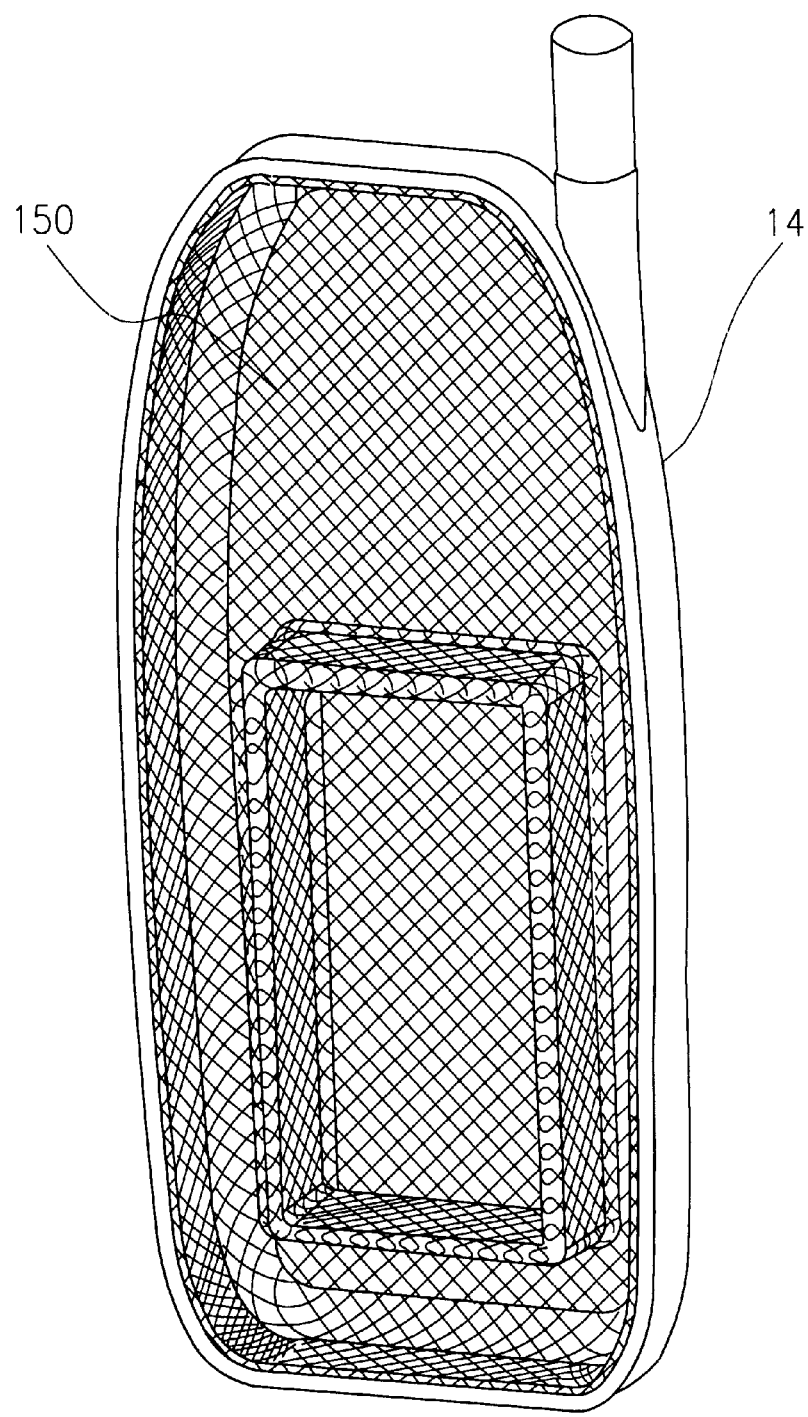
FIG. 6 shows the electrically conductive sheet of FIG. 4 attached to the inner portion of the rear cover of FIG. 2.

FIG. 6 is a top plan view of the rear cover 14 of FIG. 2, wherein the EMI shield 150 in the form of the electrically conductive fabric sheet is shown within the interior of the cover. The fabric sheet may be placed in the interior as a pre-formed piece conforming to the interior size and shape of the cover 14, or may be fitted into place by insertion by the mold forming the cover by placing the fabric sheet between the mold and the interior of the cover and moving the mold to press the sheet into place in an operation similar to that in making initial molded cover.

Figure 7:
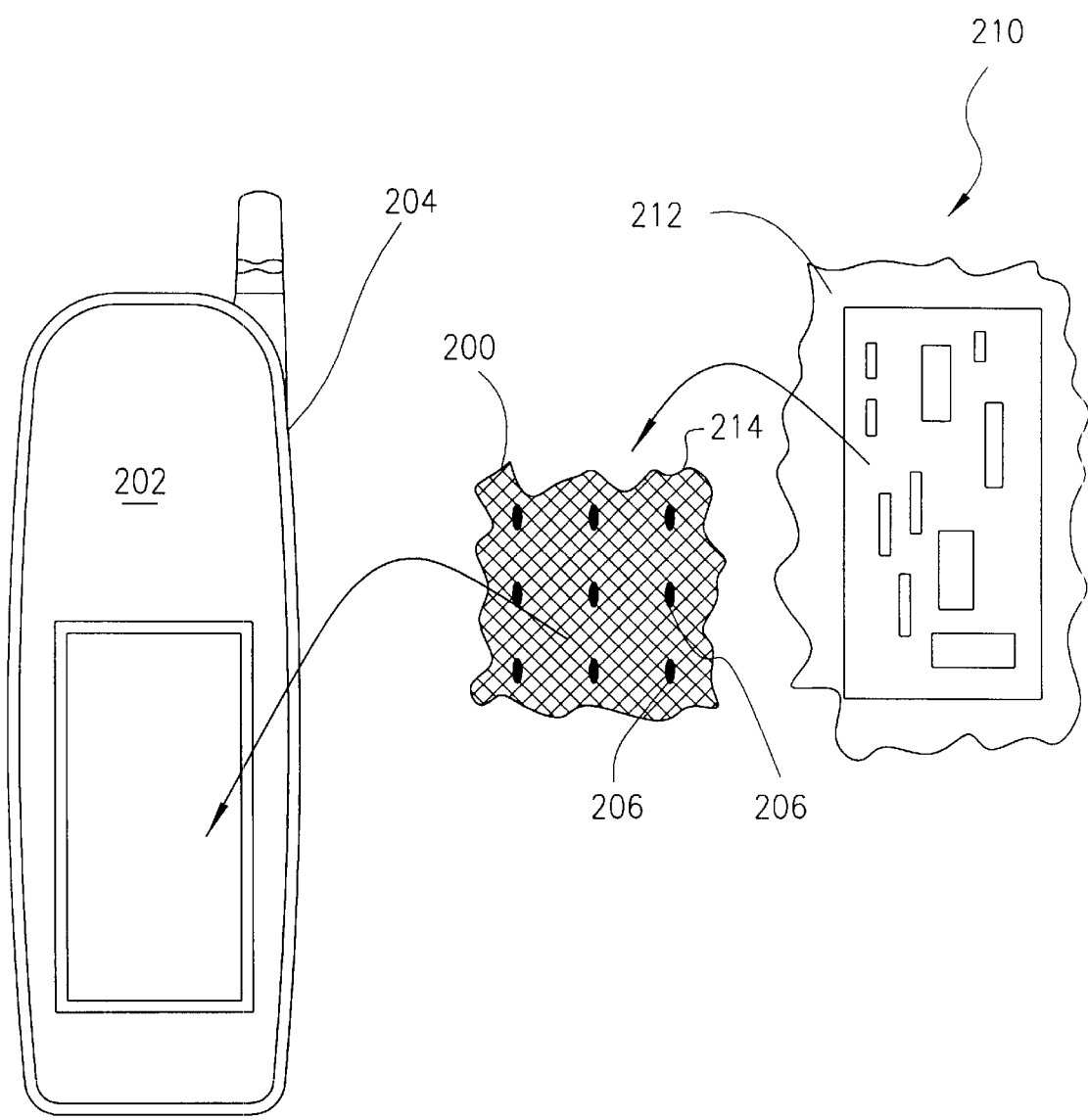
FIG. 7 is a schematic exploded view showing the assembly of an EMI shield and electronic printed circuit board in the rear cover of a cellular telephone.

FIG. 7 is an exploded schematic representation of the assembly of the EMI shield and electronic printed circuit board to the interior of the cover of the electronic device. As illustrated in FIG. 7, the EMI shield fabric sheet 200 is placed in contact with the interior surface 202 of the cover 204 with the adhesive glue drops 206 in facing relationship with the interior surface 202 of the cover 204. Once the EMI shield 200 is in place, the electronic circuit board 210 is located and mounted within the cover 204 such that the printed circuit electrical ground reference potential path surfaces 212 come in electrical and mechanical contact with the exposed conductive face 214 of the EMI shield 200, as illustrated schematically in FIG. 5.

Figure 8:
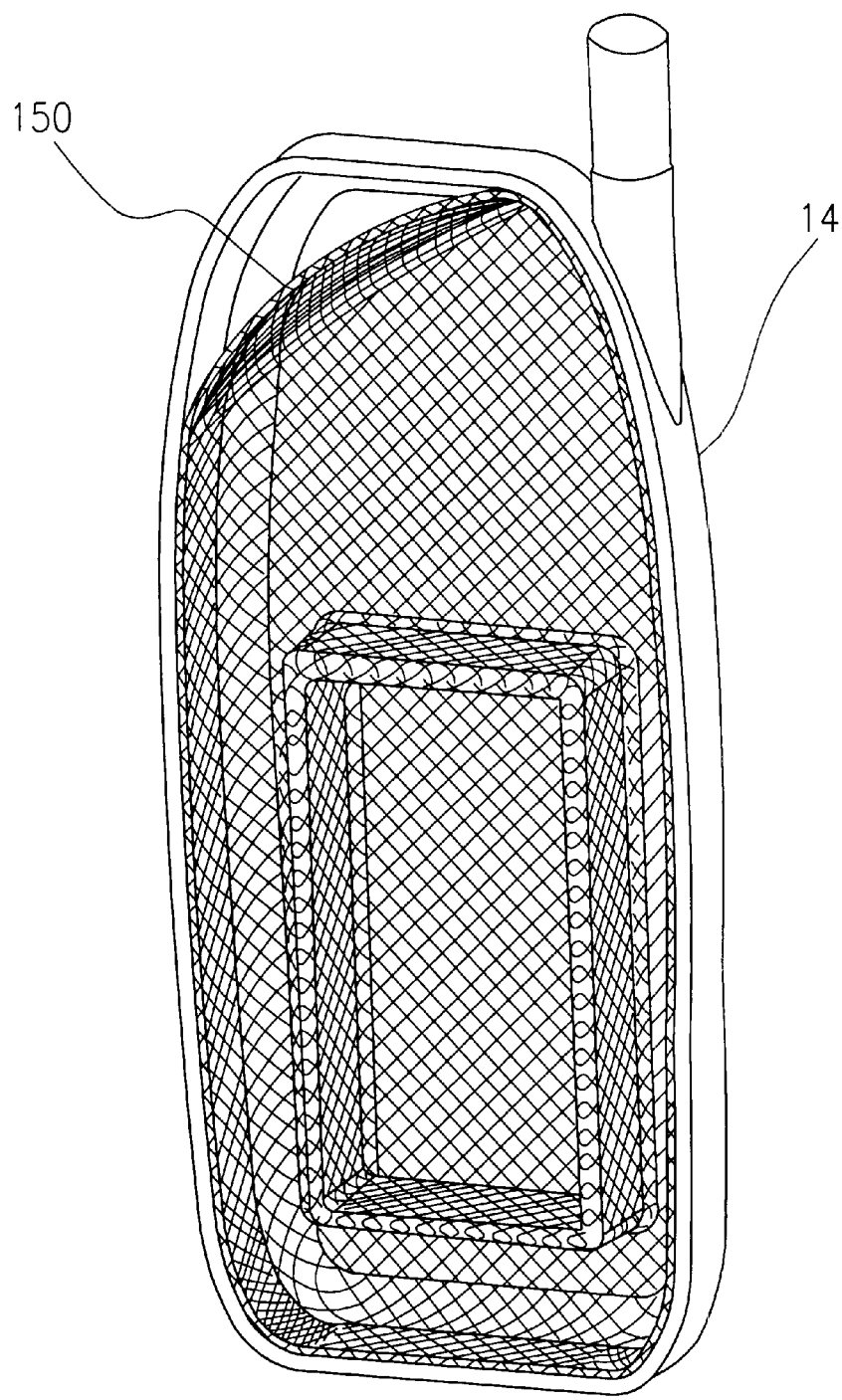
FIG. 8 shows the electrically conductive sheet of FIG. 4 partially removed from the rear cover of FIG. 2.

Turning now to FIG. 8, the EMI shield 150 is shown partially pulled away from the interior of the cover 14 as it might be during the removal process to separate the EMI shield from the cover. The fabric sheet comprising the EMI shield is of sufficient strength to resist tearing during the removal process to facilitate separation of the EMI shield from the cover.

Figure 9:
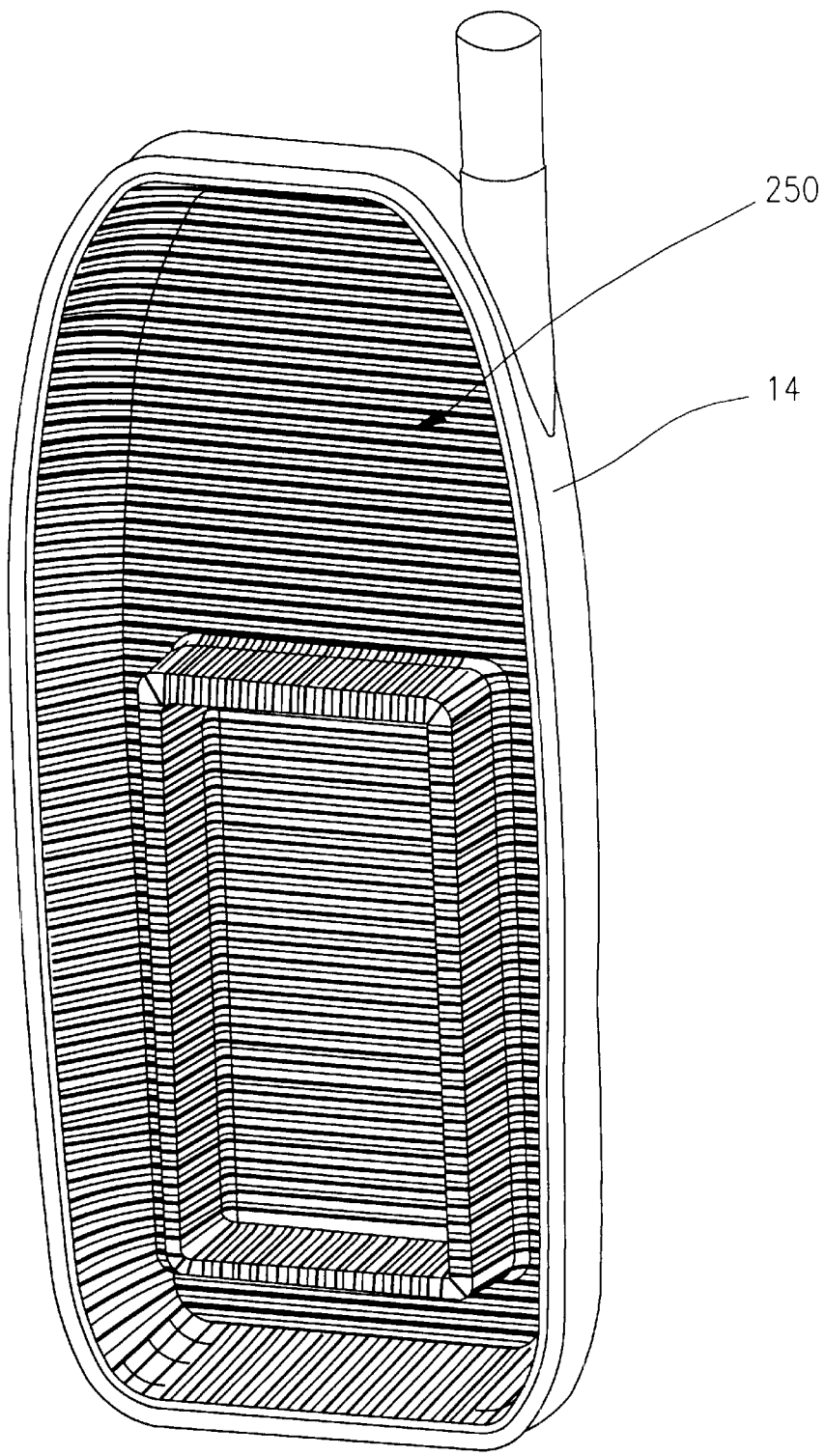
FIG. 9 shows the inner portion of the rear cover of FIG. 2 covered with a conductive polymer coating.

Turning now to FIG. 9, an alternate embodiment of the present invention is illustrated therein, wherein a coating of a conductive polymer paint, shown generally as 250, is applied to the surface of the interior area of the cover 14 as shown in FIG. 2. In order to facilitate removal of the coating of the conductive polymer paint forming the EMI shield, the surface of the interior of the cover is treated to modify its adhesion properties to allow the subsequently applied polymer coating to be peeled away from the surface for separation of the polymer coating from the cover. The surface of the interior of the cover 14 may be highly polished or waxed, in which case the adhesion properties of the surface are reduced such that the adhesion force between the conductive polymer paint coating and the surface of the interior of the cover is less than the inherent cohesion forces of the conductive polymer paint coating itself to allow peeling of the conductive polymer paint coating from the interior of the wall surface without tearing the polymer coating.

An electronic device molded cover having a releasable EMI shield has been described above in several embodiments. It will be recognized by those skilled in the art and having benefit of the above disclosure of the invention that additional modification and substitutions may be made, such as, for example, the surface of the interior wall may be treated with a lubricant to lessen the adhesion properties of the interior surface of the cover while still providing sufficient adhesion to maintain the polymer coating in place during manufacture and during the life of the product. Therefore, the invention has been described by way of illustration rather than limitation.

What is claimed is:

1. A cover for an electronic device comprising:
   an interior chamber formed by intersecting wall surfaces;
   an EMI shield juxtaposed and in contacting relation with said interior wall surfaces and conforming substantially to the size and shape of said interior chamber and defining an integral single part thereof, said EMI shield further being releasable from contact with said interior wall surfaces and removable from said interior chamber for separating said cover and said EMI shield into respective individual parts.

2. A cover for an electronic device as defined in claim 1, wherein said EMI shield comprises an electrically conductive fabric sheet.

3. A cover for an electronic device as defined in claim 2, wherein said electrically conductive fabric sheet is releasably fastened to the surface of said interior wall by an adhesive means applied to a face of said fabric sheet.

4. A cover for an electronic device as defined in claim 3, wherein said adhesive means are drops of glue in a spaced relation from one another.

5. A cover for an electronic device as defined in claim 3, wherein said adhesive means is an adhesive spray.

6. A cover for an electronic device as defined in claim 3, wherein said adhesive means is heat activated.

7. A cover for an electronic device as defined in claim 3, wherein said electrically conductive fabric sheet is of sufficient strength to resist tearing during removal from said cover.

8. A cover for an electronic device as defined in claim 2, wherein said electrically conductive fabric sheet comprises a woven mesh of conductive fibers.

9. A cover for an electronic device as defined in claim 8, wherein said conductive fibers comprise silver-coated thread.

10. A cover for an electronic device as defined in claim 2, wherein said electrically conductive fabric sheet is pliable.

11. A cover for an electronic device as defined in claim 2, wherein said electrically conductive fabric sheet is stretchable.

12. A cover for an electronic device as defined in claim 1, wherein said EMI shield is pre-formed to the size and shape of said interior chamber.

13. A cover for an electronic device as defined in claim 1, wherein said cover is molded from a thermoplastic polymer blend.

14. A cover for an electronic device as defined in claim 13, wherein said EMI shield is fitted to said interior chamber subsequent to the molding of the cover.

15. A cover for an electronic device as defined in claim 1, wherein said EMI shield comprises a coating of a conductive polymer paint applied to an adhesion-modified surface of said interior wall forming said interior chamber, whereby the adhesion force between the conductive polymer paint coating and the surface of said interior wall is less than the inherent cohesion forces of the conductive polymer paint coating itself to allow peeling and separation of said conductive polymer paint coating from the interior wall surfaces.

16. A cover for an electronic device as defined in claim 1, further comprising said interior chamber housing electronic circuit components carried on a substrate mounted therein, said substrate having an electrical ground potential surface area, said interior chamber further having bossed regions extending generally away from a rear interior surface of said chamber toward and in proximity with said substrate electrical ground potential surface area to encompass one or more of said electronic circuit components when said substrate is assembled with said cover, wherein said portions of said EMI shield covering said bossed regions are in electrical and mechanical contact with said substrate electrical ground potential surface area.

17. An electronic device molded cover comprising an inner area having a major face surface and at least one wall portion extending from said major face surface and defining one or more chambers within said cover, and a releasable EMI shield covering at least a portion of said inner area, whereby said releasable EMI shield facilitates removal from said cover to separate said EMI shield from said cover without substantial contamination of each by the other to facilitate recycling of said EMI shield and said cover into the respective raw material of each.

18. A method for providing an EMI shielded electronic device molded cover comprising the steps of:
   providing an EMI shielding material that is conformable to the shape of the interior of the cover;
   locating the EMI shielding material in the interior of the cover; and
   releasably securing the EMI shielding material to the interior of the cover whereby the EMI shielding material is removable to separate the EMI shielding material from the cover without substantial contamination of each by the other to facilitate recycling of the EMI shielding material and the cover into the respective raw material of each.

19. The method for providing an EMI shielding electronic device molded cover as defined in claim 18, wherein the step of providing an EMI shielding material further comprises providing an electrically conductive fabric sheet having an adhesive applied to a face of the fabric sheet.

20. The method for providing an EMI shielding electronic device molded cover as defined in claim 18, wherein the step of providing an EMI shielding material further comprises the step of reducing the adhesion properties of the surfaces of the interior of the cover and the step of providing a coating of a conductive polymer paint on the interior surface of the cover.

* * * * *